US012604415B2

(12) United States Patent
Liao et al.

(10) Patent No.: US 12,604,415 B2
(45) Date of Patent: Apr. 14, 2026

(54) CIRCUIT BOARD STRUCTURE AND METHOD FOR MANUFACTURING THE SAME

(71) Applicant: TONG HSING ELECTRONIC INDUSTRIES, LTD., Taipei City (TW)

(72) Inventors: Yu-Hsien Liao, Taipei City (TW);
Shih-Han Wu, Taipei City (TW);
Jhih-Wei Lai, Taipei City (TW);
Jian-Yu Shih, Taipei City (TW);
Ming-Yen Pan, Taipei City (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 219 days.

(21) Appl. No.: 18/522,250

(22) Filed: Nov. 29, 2023

(65) Prior Publication Data

US 2025/0089176 A1      Mar. 13, 2025

(30) Foreign Application Priority Data

Sep. 8, 2023      (TW) .................................. 112134167

(51) Int. Cl.
H05K 3/12          (2006.01)
H05K 1/18          (2006.01)
(52) U.S. Cl.
CPC .................. H05K 3/12 (2013.01); H05K 1/18 (2013.01); H05K 2201/10984 (2013.01)

(58) Field of Classification Search
CPC ... H05K 3/12; H05K 1/18; H05K 2201/10984
USPC ......................................................... 361/760
See application file for complete search history.

(56) References Cited

U.S. PATENT DOCUMENTS

| | | | | |
|---|---|---|---|---|
| 6,396,707 | B1 * | 5/2002 | Huang ................. | H05K 3/3452 |
| | | | | 257/738 |
| 2017/0125329 | A1 * | 5/2017 | Lewandowski ..... | H01L 21/4853 |
| 2017/0371497 | A1 * | 12/2017 | Buvid ................... | G06T 11/206 |
| 2021/0305437 | A1 * | 9/2021 | Liu ........................ | H10F 39/804 |

FOREIGN PATENT DOCUMENTS

WO      WO-2019090762 A1 *    5/2019    ............. H10D 30/00

* cited by examiner

*Primary Examiner* — Andargie M Aychillhum
(74) *Attorney, Agent, or Firm* — Li & Cai Intellectual Property Office

(57)          ABSTRACT

A circuit board structure is provided. The circuit board structure includes a substrate, a solder mask coupler, a supporter, and a chip. The substrate has a conductive structure. The solder mask coupler is disposed on the substrate. The supporter contacts the solder mask coupler, and the supporter is fixed on the substrate via the solder mask coupler. The chip is disposed on the substrate, and the chip is electrically connected with the conductive structure.

7 Claims, 9 Drawing Sheets

CIRCUIT BOARD STRUCTURE AND METHOD FOR MANUFACTURING THE SAME

CROSS-REFERENCE TO RELATED PATENT APPLICATION

This application claims the benefit of priority to Taiwan Patent Application No. 112134167, filed on Sep. 8, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a circuit board structure and a method for manufacturing the same, and more particularly to a circuit board structure and a method for manufacturing the same by using a solder mask material to fix a supporter.

BACKGROUND OF THE DISCLOSURE

Due to their structural design, some package structures are required to have a large volume, such as a ceramic leaded chip carrier or a vertical-cavity surface emitting laser (VC-SEL). Therefore, in these package structures, a supporter is usually disposed on a substrate to support a structural stability or to extend a height-wise distance between two substrates.

Generally, a material of the supporter is a non-conductive material, e.g., an organic material. In addition to cost considerations, the non-conductive material can also prevent a short circuit or other difficulties in design.

In the conventional technology, the supporter is usually fixed on the substrate via an adhesive. However, a usage amount of the adhesive is difficult to control. When the adhesive is in an excessive amount, the adhesive may overflow to attach onto a conductor. When the adhesive is in an insufficient amount, the reliability of the package structure will be negatively influenced due to aging over a long-term usage.

Therefore, how to improve the structural design of the package structure to overcome the problems generated by fixing the supporter with the adhesive has become an important issue to be solved in the related industry.

SUMMARY OF THE DISCLOSURE

In response to the above-referenced technical inadequacies, the present disclosure provides a circuit board structure and a method for manufacturing the same.

In order to solve the above-mentioned problems, one of the technical aspects adopted by the present disclosure is to provide a circuit board structure. The circuit board structure includes a substrate, a solder mask coupler, a supporter, and a chip. The substrate has a conductive structure. The solder mask coupler is disposed on the substrate. The supporter contacts the solder mask coupler, and the supporter is fixed on the substrate via the solder mask coupler. The chip is disposed on the substrate, and the chip is electrically connected with the conductive structure.

In one of the possible or preferred embodiments, a bottom surface of the supporter contacts the solder mask coupler, and the bottom surface of the supporter has a protruding part embedded into the solder mask coupler.

In one of the possible or preferred embodiments, the supporter has a top surface and a bottom surface opposite to each other, the bottom surface of the supporter contacts the solder mask coupler, and an area of the bottom surface is larger than an area of the top surface.

In one of the possible or preferred embodiments, the bottom surface of the supporter has a protruding part embedded into the solder mask coupler.

In one of the possible or preferred embodiments, the supporter is a non-conductive material.

In one of the possible or preferred embodiments, a material of the solder mask coupler includes a barium element.

In one of the possible or preferred embodiments, the supporter and the substrate do not have an adhesive therebetween.

In order to solve the above-mentioned problems, another of the technical aspects adopted by the present disclosure is to provide a method for manufacturing the same. The method includes steps of: coating a solder mask material onto a substrate having a conductive structure; subjecting the solder mask material to an exposure process, so as to demarcate the solder mask material between a retained region and a protection region; disposing a supporter onto and contacting the solder mask material in the retained region; subjecting the solder mask material to a solidification process, so as to form a solder mask coupler from the solder mask material in the retained region, in which the supporter is fixed on the substrate via the solder mask coupler; subjecting the solder mask material to a development process, so as to remove the solder mask material in the protection region; and disposing a chip onto the substrate, the chip being electrically connected with the conductive structure.

In one of the possible or preferred embodiments, before being subjected to the development process, the solder mask material changes from a paste state into a solid state during the solidification process.

In one of the possible or preferred embodiments, after the solidification process, a part of the solder mask material in the retained region is turned into the solder mask coupler, and another part of the solder mask material in the retained region forms a solder mask protector. The solder mask protector is in contact with the conductive structure.

Therefore, in the circuit board structure and the method for manufacturing the same provided by the present disclosure, by virtue of "the supporter contacting the mask solder connector" and "the supporter disposed on the substrate via the solder mask coupler," the coupling force of the supporter on the substrate can be enhanced, and the usage of the adhesive can be omitted.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

3

4

Figure 1:
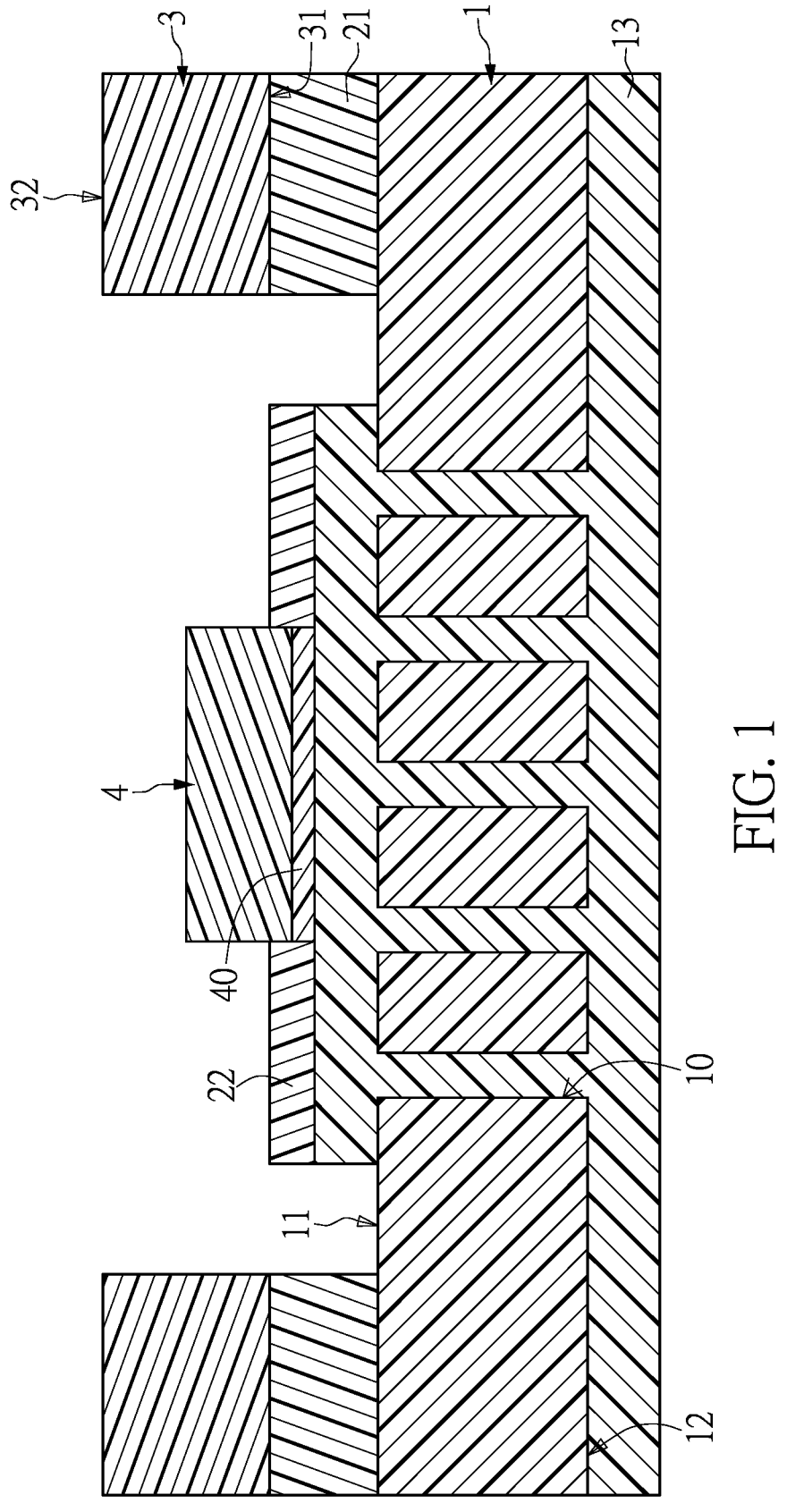
Figure 7:
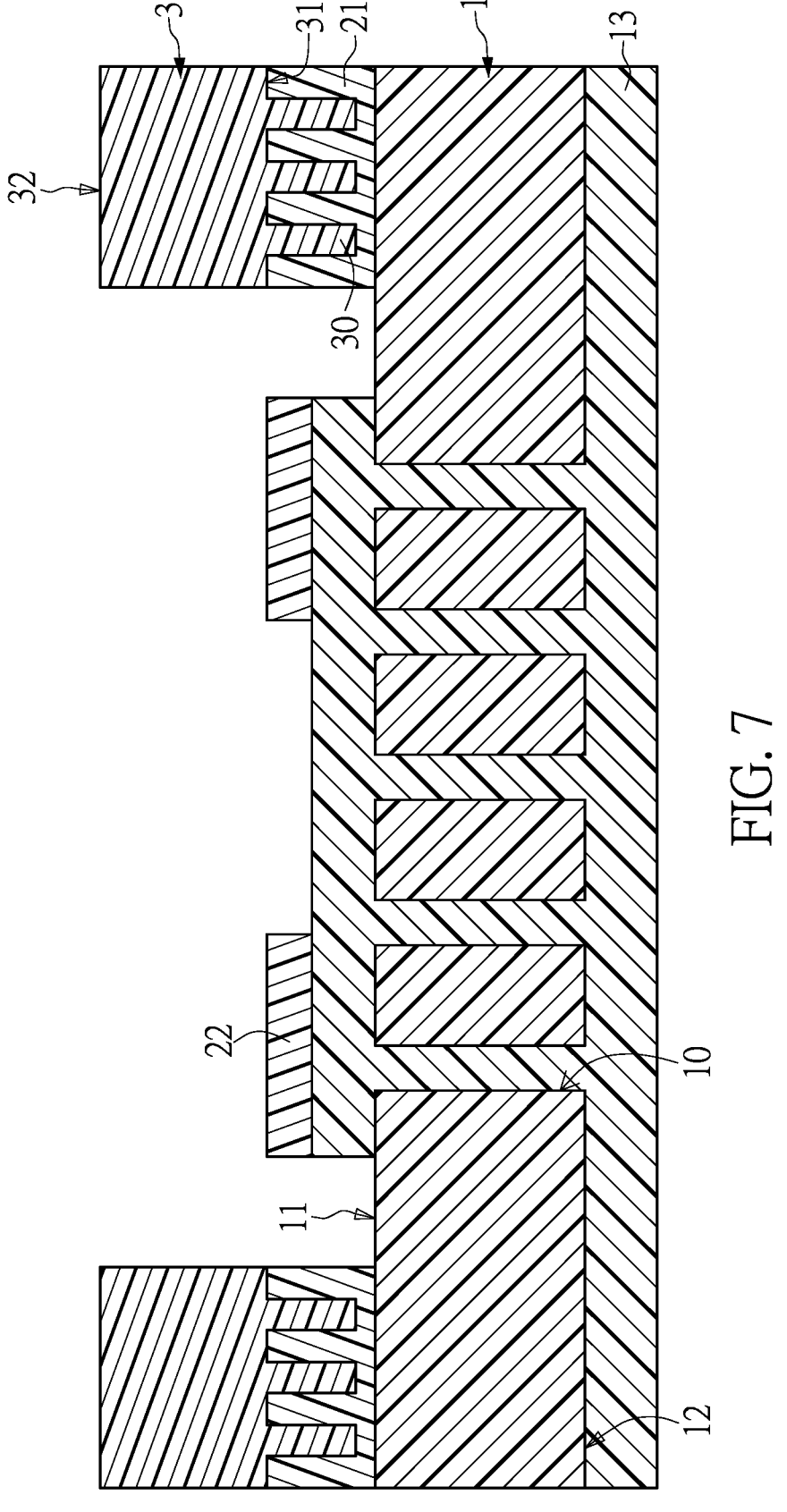
Figure 8:
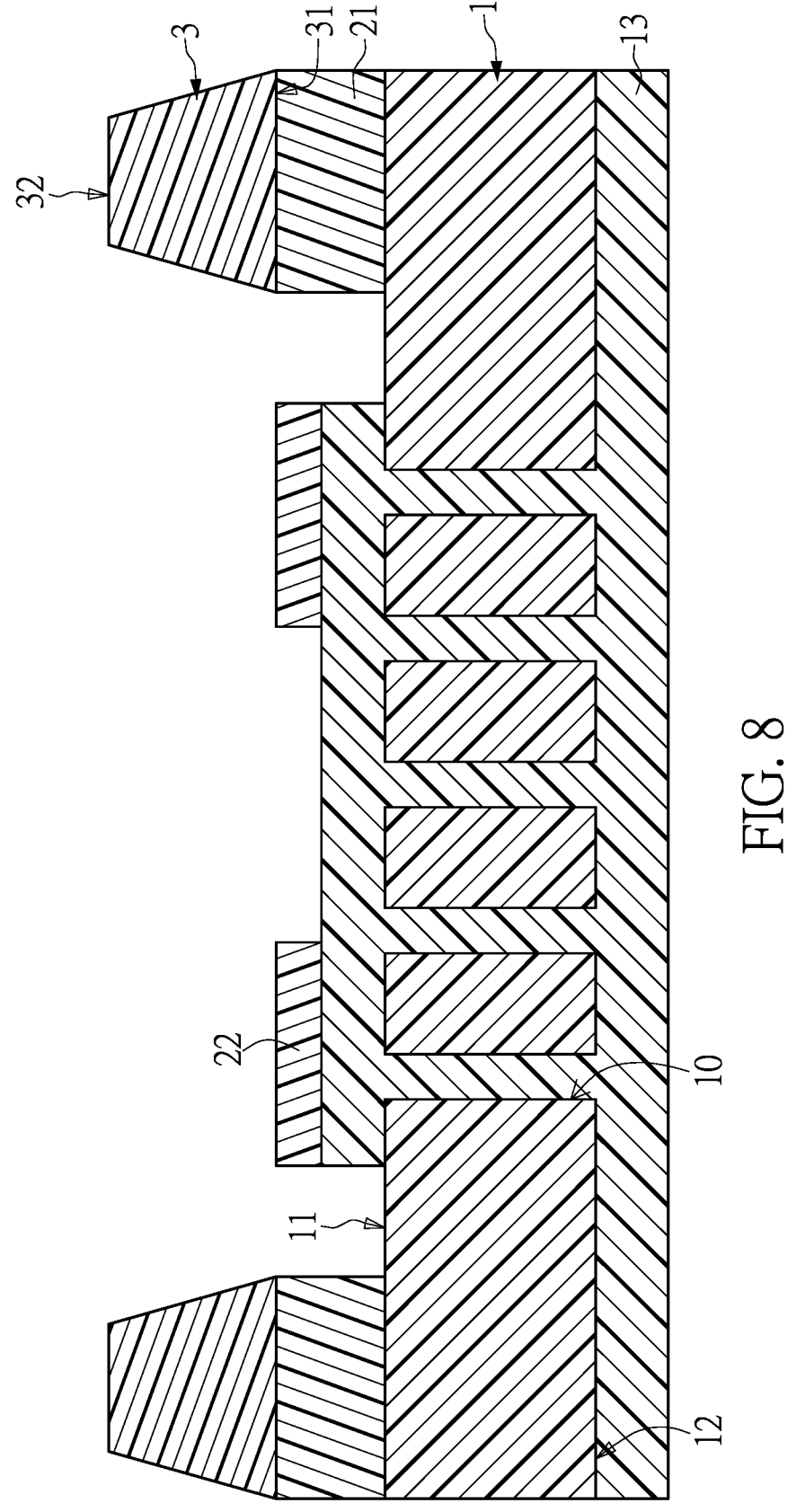
Figure 9:
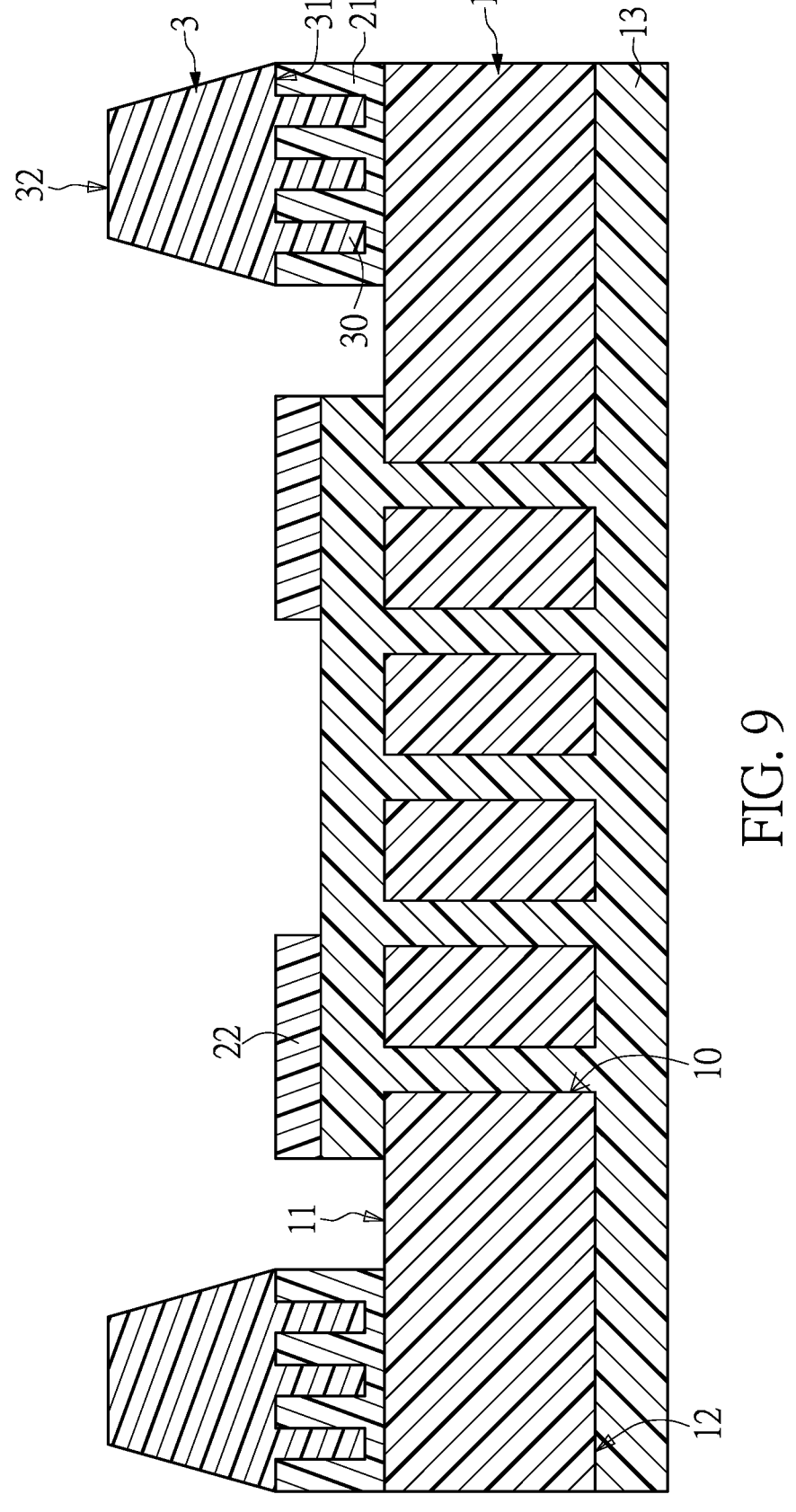

FIG. 1 is a side schematic view of a circuit board structure according to a first embodiment of the present disclosure;

FIG. 2 to FIG. 6 are side schematic views of a method for manufacturing the circuit board structure according to the first embodiment of the present disclosure;

FIG. 7 is a side schematic view of the circuit board structure according to a second embodiment of the present disclosure;

FIG. 8 is a side schematic view of the circuit board structure according to a third embodiment of the present disclosure; and FIG. 9 is a side schematic view of the circuit board structure according to a fourth embodiment of the present disclosure.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

In order to overcome the problem caused by using an adhesive to fix a supporter in position, a circuit board structure and a method for manufacturing the same are provided. In the present disclosure, the supporter is fixed on a substrate by a solder mask material. The uncured solder mask material can replace adhesives that are currently available, such that the problems caused by using the adhesive can be overcome.

Referring to FIG. 1, the circuit board structure of the present disclosure includes a substrate 1, a solder mask coupler 21, a supporter 3, and a chip 4.

The substrate 1 is used to carry the solder mask coupler 21, the supporter 3, and the chip 4.

A conductive structure 13 is disposed on the substrate 1 and forms a pattern. The conductive structure 13 can be selectively disposed on a top surface 11, a bottom surface 12, or both the top surface 11 and the bottom surface 12 of the substrate 1.

According to structural designs, a through hole 10 can be formed on the substrate 1. Therefore, the conductive structure 13 can be disposed in the through hole 10. In other words, the conductive structure 13 disposed through the top surface 11 and the bottom surface 12 can electrically connect components which are located on two opposite sides, i.e., the top surface 11 and the bottom surface 12 of the substrate 1. For example, the chip 4 can be electrically connected with an outer circuit via the conductive structure 13.

The substrate 1 can be a ceramic substrate, a resin substrate, or a glass substrate. However, a material of the substrate 1 can be adjusted according to requirements, and is not limited thereto.

The solder mask coupler 21 enables the supporter 3 to be fixed on the substrate 1. Specifically, the solder mask coupler 21 is disposed between the substrate 1 and the supporter 3, and respectively contacts the substrate 1 and the supporter 3. The solder mask coupler 21 of the present disclosure can replace adhesives that are currently available on the market, such as an epoxy adhesive or a conductive adhesive. That is to say, the adhesive can be absent between the supporter 3 and the substrate 1.

The solder mask coupler 21 is formed from a solder mask material. The solder mask material is in a paste state before solidification. Due to its stickiness, the solder mask material can be used to fix the supporter 3. For example, the solder mask material includes a barium (Ba) element. In an exemplary embodiment, the solder mask material includes a carbon (C) element, an oxygen (O) element, a silicon (Si) element, a sulfur (S) element, and a barium (Ba) element, and can further include a bromine (Br) element. The solder mask coupler 21 is solidified from the solder mask material. Hence, a material of the solder mask coupler 21 includes a barium (Ba) element. In an exemplary embodiment, the material of the solder mask coupler 21 includes a carbon (C) element, an oxygen (O) element, a silicon (Si) element, a sulfur (S) element, and a barium (Ba) element, and can further include a bromine (Br) element.

The solder mask material mentioned above can also be disposed on the substrate 1 to serve as a solder mask protector 22. The solder mask protector 22 can form a patterned structure on the substrate 1 (the conductive structure 13), so as to meet an overall design of the circuit board structure or obstruct water vapor and oxygen gas from contacting the conductive structure 13.

Since the solder mask coupler 21 and the solder mask protector 22 are both formed from the solder mask material, the solder mask coupler 21 and the solder mask protector 22 can be disposed in the same process. In addition, the solder mask material is a material that will originally be used for manufacturing the circuit board structure, such that the solder mask material will not pollute a surface treatment of the conductive structure 13.

A color of the solder mask coupler 21 is not limited to white, green, or black. When the circuit board structure is applied in a light-emitting device, a white solder mask coupler 21 can be chosen to reflect light. When the circuit board structure is applied in a LiDAR (light detection and ranging), a black solder mask coupler 21 can be chosen to absorb light. In other embodiments, a green solder mask coupler 21 can also be chosen for maintaining a consistency of an overall structure.

The supporter 3 is disposed on the substrate 1 via the solder mask coupler 21. The supporter 3 can support two substrates and extend a distance between the two substrates, so as to meet the location design of the components. Regarding a light-emitting device, the supporter 3 can enlarge a space between the two substrates for concentrating light and enhancing luminous efficacy.

A material of the supporter 3 is a non-conductive material, such as a ceramic, a liquid crystal polymer, or a plastic polymer (e.g., an epoxy resin). A shape of the supporter 3 is not limited to that shown in FIG. 1. Other variations of the supporter 3 are illustrated below.

The chip 4 is electrically connected with the conductive structure 13, such that the chip 4 can be electrically connected with an outer circuit via the conductive structure 13. The chip 4 can be disposed on the substrate 1 via a connector 40. Specifically, the connector 40 can be a solder pad, a conductive adhesive, or a die-attach adhesive, but the present disclosure is not limited thereto.

In the method for manufacturing the circuit board structure, FIG. 2 to FIG. 6 show side schematic views for manufacturing the circuit board structure.

Figure 2:
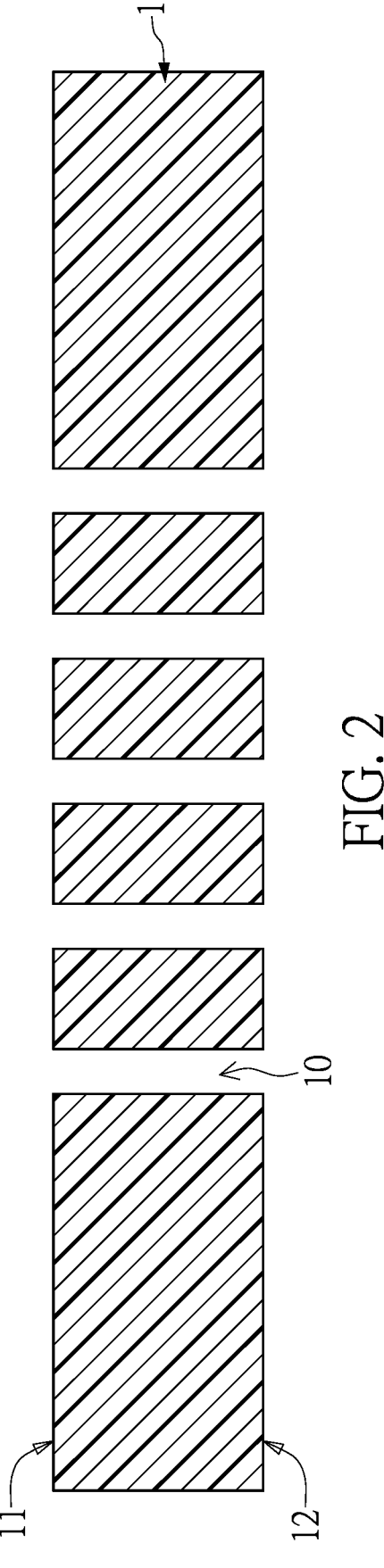

According to a structural design, one or a plurality of the through holes 10 can be formed on the substrate 1, as shown in FIG. 2. The through hole 10 is formed through the top surface 11 and the bottom surface 12 of the substrate 1. Therefore, the conductive structure 13 can be disposed through the top surface 11 and the bottom surface 12 of the substrate 1 by a process of direct plated copper (DPC), as shown in FIG. 3.

Figure 3:
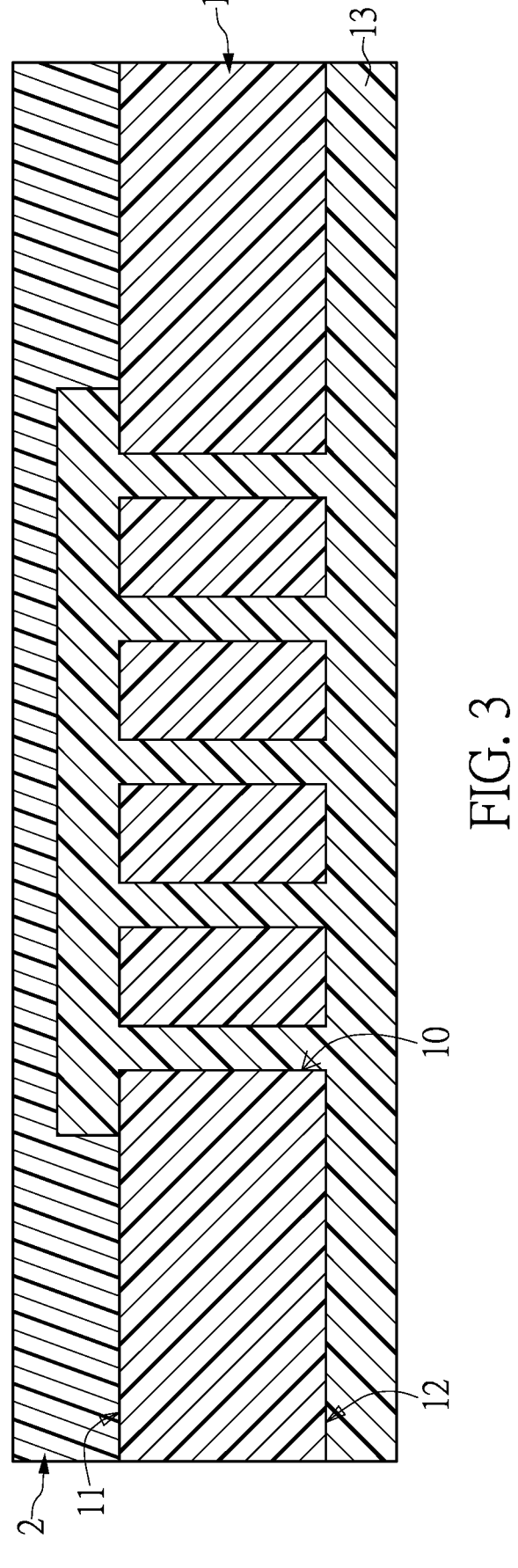

Referring to FIG. 3, the conductive structure 13 is disposed in the through hole 10 and extends toward the top surface 11 and the bottom surface 12 of the substrate 1. Therefore, the disposition of the conductive structure 13 enables the components that are disposed on the two sides of the substrate 1 to electrically connect with each other.

The solder mask material 2 is coated on the top surface 11 of the substrate 1, and the conductive structure 13 is completely covered by the solder mask material 2. Subsequently, a mask is placed on the solder mask material 2. Light can pass through a part of the mask but will be sheltered from another part of the mask.

Figure 4:
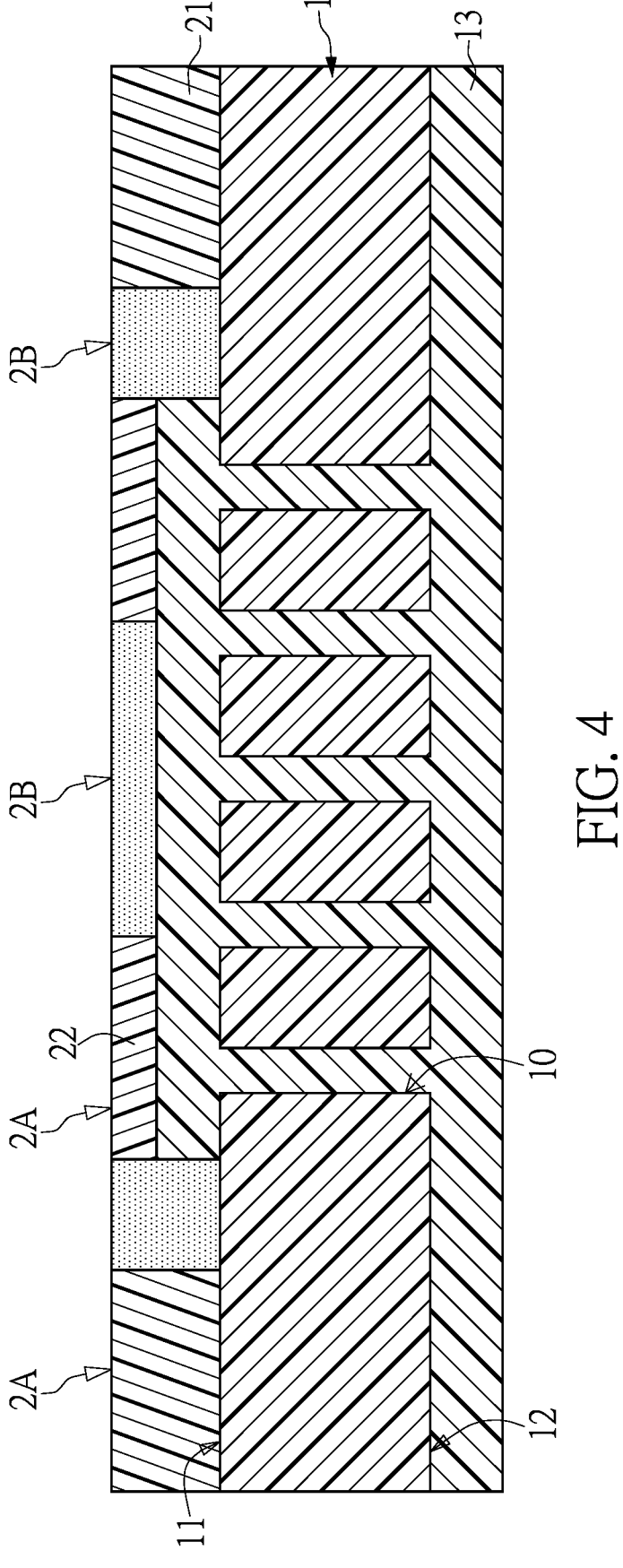

In an exposure process, a part of the solder mask material 2 is subjected to an exposure treatment, but the other part of the solder mask material 2 is sheltered and not subjected to the exposure treatment. In other words, after the exposure process, the solder mask material 2 is demarcated between a retained region 2A and a protection region 2B according to a pattern of the mask, as shown in FIG. 4.

Specifically, the solder mask material 2 in the retained region 2A is subjected to the exposure treatment and will not be removed in a following development process. The solder mask material 2 in the retained region 2A remains in the circuit board structure to finally form a solder mask coupler 21 or a solder mask protector 22. The solder mask material 2 in the protection region 2B is not subjected to the exposure treatment, which can be temporarily disposed on the substrate 1 to protect the substrate 1 from being polluted by other components. Whereas, the solder mask material 2 in the protection region 2B will be removed in the following development process.

The solder mask material 2 in the retained region 2A has different functions according to different locations. For example, the solder mask material 2 in contact with the supporter 3 can be used as the solder mask coupler 21, so as to fix the supporter 3 onto the substrate 1. The solder mask material 2 in contact with the conductive structure 13 can be used as the solder mask protector 22, so as to prevent the conductive structure 13 from being polluted in other processes. Moreover, the solder mask coupler 21 and the solder mask protector 22 can be disposed in the same process.

For example, when the solder mask material 2 is a negative photoresist, the solder mask material 2 in the retained region 2A is exposed to light so as to form the solder mask coupler 21 or the solder mask protector 22. The solder mask material 2 in the protection region 2B is not exposed to light, thereby being removed by a developer in a following process.

However, the description mentioned above is only one example of the first embodiment, and a type of the solder mask material 2 is not limited thereto. The solder mask material 2 can also be a positive photoresist. Furthermore, the design of the retained region 2A or the function of the solder mask material 2 is not limited to what is described above. After the exposure process, the solder mask coupler 21 can be disposed on the substrate 1 on its own, or the solder mask coupler 21 and the solder mask protector 22 can be disposed on the substrate 1 together.

Figure 5:
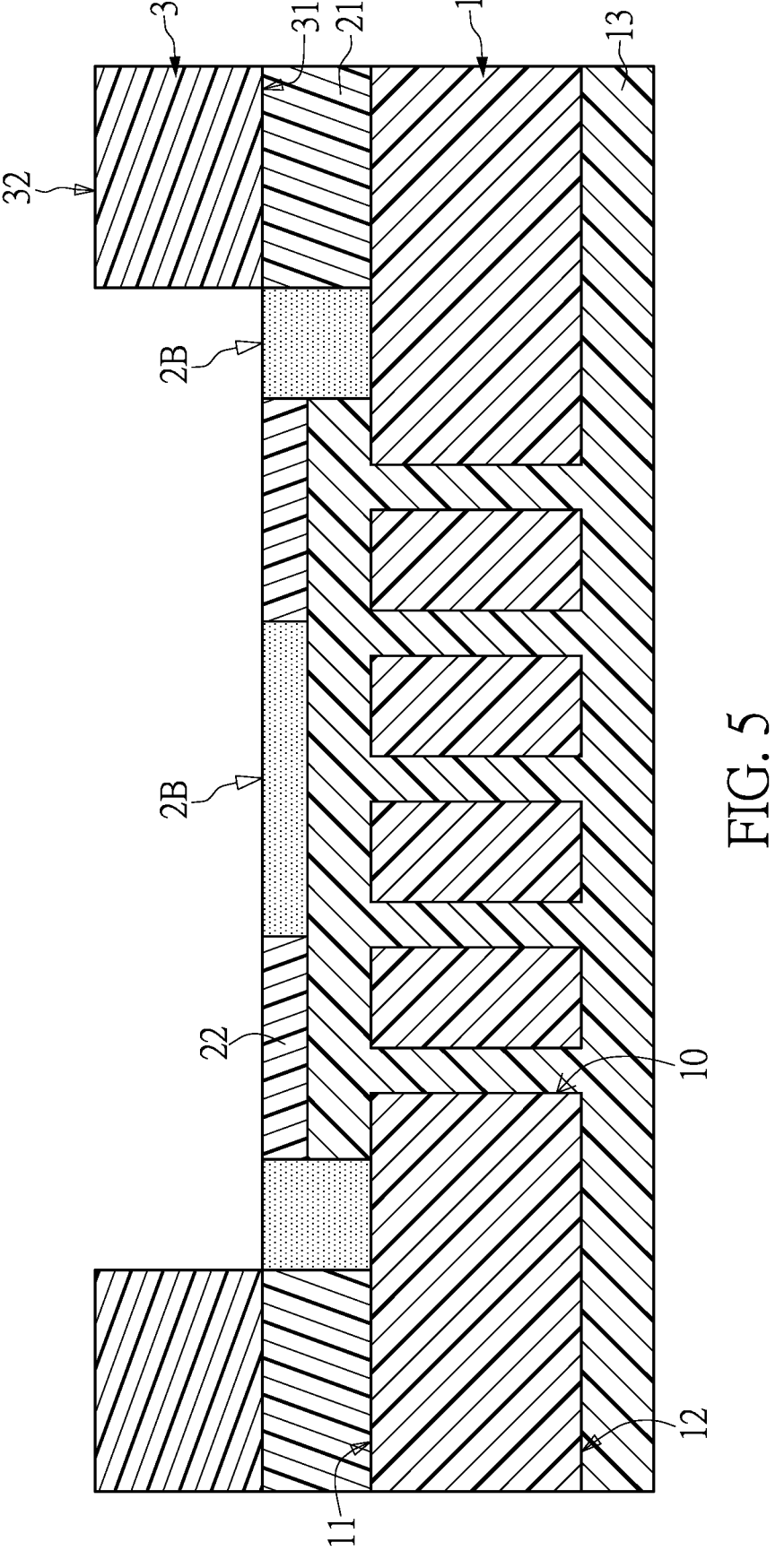

Referring to FIG. 5, the solder mask material 2 is not solidified after the exposure process. Hence, the solder mask material 2 is in a paste state and has a certain stickiness. Accordingly, the supporter 3 can be disposed on the solder mask material 2 and contact the solder mask material 2. It should be noted that the solder mask material 2 to form the solder mask coupler 21 needs to be subjected to the exposure treatment to avoid being removed in the development process.

After disposing the supporter 3, the solder mask material 2 is subjected to a solidification process, such as being baked at a high temperature. During the solidification process, the solder mask material 2 changes from a paste state into a solid state. A part of the solder mask material 2 in the retained region 2A becomes the solder mask coupler 21, and another part of the solder mask material 2 in the retained region 2A becomes the solder mask protector 22. The supporter 3 is fixed on the substrate 1 via the solder mask coupler 21.

Figure 6:
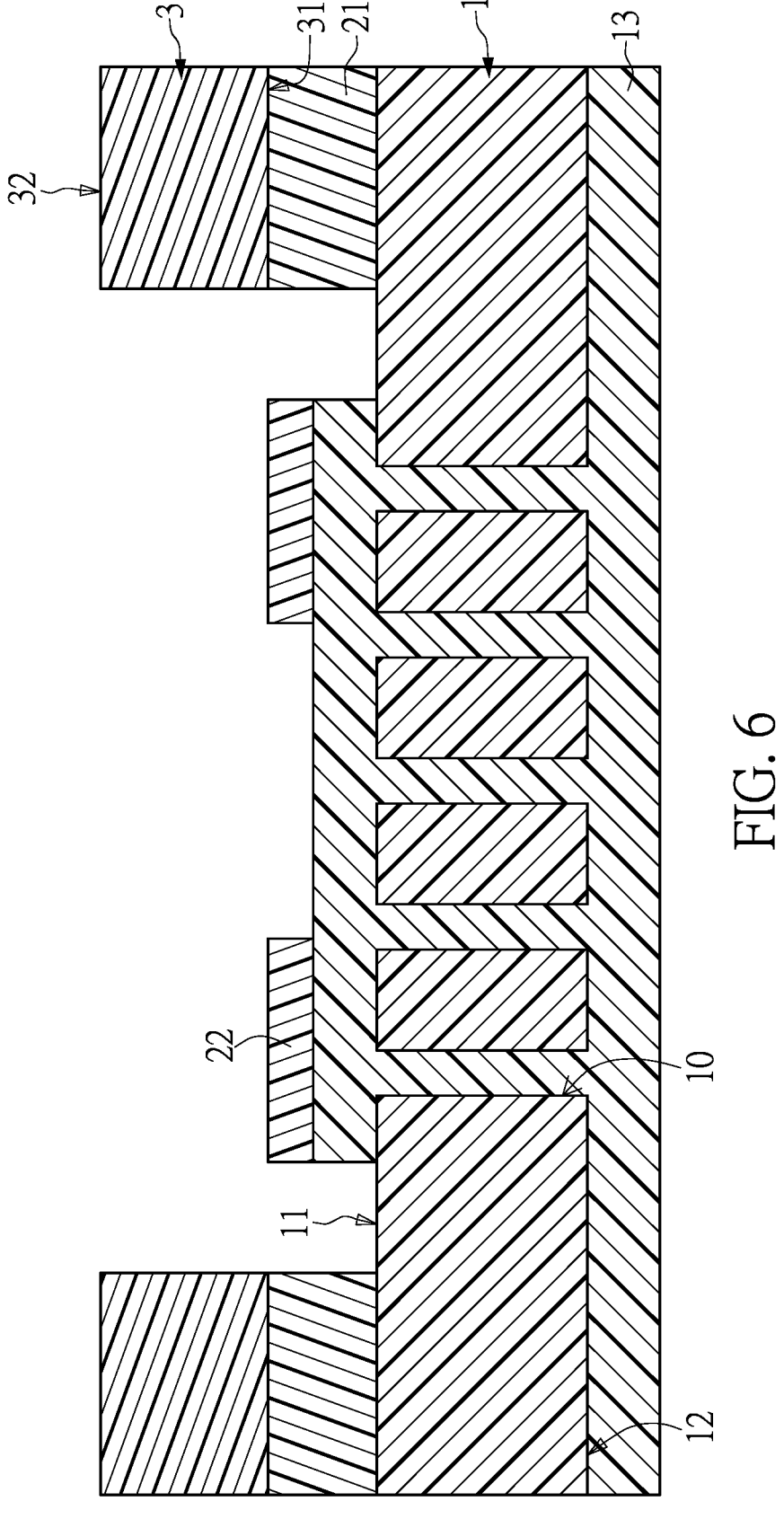

Subsequently, the solder mask material 2 is subjected to the development process so as to remove the solder mask material 2 in the protection region 2B, as shown in FIG. 6. Since the solder mask material 2 in the retained region 2A, i.e., the solder mask coupler 21 and the solder mask protector 22, has been subjected to the exposure treatment, it is not removed by the developer in the development process.

After the development process, the chip 4 is disposed on the substrate 1 and electrically connected with the conductive structure 13, so as to obtain the circuit board structure as shown in FIG. 1. Specifically, the chip 4 can be disposed on the substrate 1 via a connector 40. The connector 40 can be a solder pad, a conductive adhesive, or a die-attach, but the present disclosure is not limited thereto.

The circuit board structure can further include an upper substrate, which is disposed on the supporter 3. Specifically, the upper substrate can be fixed on the supporter 3 via a connector. The connector can be an adhesive, such as an epoxy adhesive. Since the connector does not contact the conductive structure 13, as long as the conductive structure 13 is not polluted, there is no restriction for the selection of material of the connector. Furthermore, it should be noted that in other embodiments of the present disclosure, the upper substrate may not be a necessary component.

The structure of the supporter 3 is designed to have variations. Referring to FIG. 7, the supporter 3 can have a protruding part 30 which contacts the solder mask coupler 21. Due to the protruding part 30, a contact area between the supporter 3 and the solder mask coupler 21 can be increased, thereby enhancing a coupling force between the supporter 3 and the solder mask coupler 21. Specifically, the protruding part 30 protrudes from a bottom surface 31 of the supporter 3. The protruding part 30 has a plurality of fins. Before the solidification process, the solder mask material 2 is still in the paste state. Therefore, when the supporter 3 is disposed onto the solder mask material 2, the protruding part 30 can be embedded into the solder mask material 2.

Referring to FIG. 8, in an exemplary embodiment, the supporter 3 has a wider bottom surface 31 and a narrower top surface 32. Specifically, an area of the bottom surface 31 is larger than an area of the top surface 32. The bottom surface 31 having a large area increases the contact area between the supporter 3 and the solder mask coupler 21, thereby enhancing a coupling force between the supporter 3 and the solder mask coupler 21. In addition, when the circuit board structure is applied in a light-emitting device, the supporter 3 having a wider bottom surface 31 and a narrower top surface 32 helps concentrate light and enhance luminous efficacy.

Referring to FIG. 9, in another exemplary embodiment, the supporter 3 can have a wider bottom surface 31 and a narrower top surface 32. Furthermore, the protruding part 30 extends from the bottom surface 31 of the supporter 3.

Experiment Data

According to the circuit board structure shown in FIG. 1, the solder mask material (provided by TAIYO HOLDINGS CO., LTD., model: PSR-4000 G23KHP) is used to manufacture six identical circuit board structures as samples (Example 1). An adhesive (provided by ESL ELECTRO-SCIENCE, model: 240SB) is used to replace the solder mask material of the circuit board structure in Example 1, so as to manufacture six identical circuit board structures as samples (Comparative Example 1).

The samples of Example 1 and Comparative Example 1 are reflowed at 260° C. for three times. A maximum shear force that the circuit board structure of Example 1 and the circuit board structure of Comparative Example 1 can withstand are measured by a solder ball thrust machine according to JESD22-B117A standard (so as to quantify a coupling force).

The maximum shear force that the circuit board structure of Example 1 and the circuit board structure of Comparative Example 1 can withstand are listed in Table 1. In Table 1, a shear force ratio indicates a ratio of the maximum shear force that the circuit board structure of Example 1 can withstand to the maximum shear force that the circuit board structure of Comparative Example 1 can withstand.

TABLE 1

| | Maximum shear force of circuit board structure which can withstand (kg) | | Shear force ratio |
|---|---|---|---|
| | Example 1 | Comparative Example 1 | |
| Sample 1 | 13.12 | 12.16 | — |
| Sample 2 | 14.02 | 12.65 | — |
| Sample 3 | 18.08 | 8.13 | — |
| Sample 4 | 16.10 | 10.15 | — |
| Sample 5 | 13.81 | 11.80 | — |
| Sample 6 | 11.89 | 10.13 | — |
| Maximum | 18.08 | 12.65 | 143% |
| Minimum | 11.89 | 8.13 | 146% |
| Average value | 14.50 | 10.84 | 134% |

According to Table 1, the currently available adhesive can be replaced by the solder mask material of the present disclosure. The solder mask coupler 21 can fix the supporter 3 onto the substrate 1. Moreover, compared to the currently available adhesive, using the solder mask coupler 21 can enhance the coupling force there-between.

Specifically, the maximum shear force that the supporter 3 disposed on the substrate 1 can withstand is higher than 10 kg, and preferably ranges from 11 kg to 19 kg. Compared to the currently available adhesive, using the solder mask coupler 21 to fix the supporter 3 can withstand a higher shear force.

In addition to a better coupling force, using the solder mask coupler 21 to fix the supporter 3 can also simplify the method for manufacturing the circuit board structure. During the method for manufacturing the circuit board structure, the solder mask coupler 21 and the solder mask protector 22 can both be disposed in the exposure process, so as to fix supporter 3 (by the solder mask coupler 21) and protect the conductive structure 13 (by solder mask protector 22). Moreover, the omission of the adhesive can not only simplify the manufacturing method, but also prevent problems caused by the difficulties in controlling the usage amount of the adhesive.

Beneficial Effects of the Embodiments

In conclusion, in the circuit board structure and the method for manufacturing the same provided by the present disclosure, by virtue of "the supporter contacting the mask solder connector" and "the supporter being disposed on the substrate via the solder mask coupler," the coupling force of the supporter on the substrate can be enhanced, and the usage of the adhesive can be omitted.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A circuit board structure, comprising:
a substrate having a conductive structure;
a solder mask coupler disposed on the substrate;
a supporter contacting the solder mask coupler, wherein the solder mask coupler is sandwiched between the substrate and the supporter, and the solder mask coupler directly binds the substrate and the supporter to fix the supporter onto the substrate; and
a chip disposed on the substrate, and being electrically connected with the conductive structure.

2. The circuit board structure according to claim 1, wherein a bottom surface of the supporter contacts the solder mask coupler, and the bottom surface of the supporter has a protruding part embedded into the solder mask coupler.

3. The circuit board structure according to claim 1, wherein the supporter has a top surface and a bottom surface opposite to each other, the bottom surface of the supporter contacts the solder mask coupler, and an area of the bottom surface is larger than an area of the top surface.

4. The circuit board structure according to claim 3, wherein the bottom surface of the supporter has a protruding part embedded into the solder mask coupler.

5. The circuit board structure according to claim 1, wherein the supporter is a non-conductive material.

6. The circuit board structure according to claim 1, wherein a material of the solder mask coupler includes a barium element.

7. The circuit board structure according to claim 1, wherein the supporter and the substrate do not have an adhesive there-between.

\*    \*    \*    \*    \*